United States Patent
Padilla et al.

(10) Patent No.: US 11,488,890 B2
(45) Date of Patent: Nov. 1, 2022

(54) DIRECT LIQUID COOLING WITH O-RING SEALING

(71) Applicant: Google LLC, Mountain View, CA (US)

(72) Inventors: Jorge Padilla, Union City, CA (US); Madhusudan K. Iyengar, Foster City, CA (US); Connor Burgess, Alameda, CA (US); Padam Jain, San Jose, CA (US); Yuan Li, Sunnyvale, CA (US); Feini Zhang, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 1 day.

(21) Appl. No.: 16/880,417

(22) Filed: May 21, 2020

(65) Prior Publication Data

US 2021/0366807 A1   Nov. 25, 2021

(51) Int. Cl.
*H01L 23/433* (2006.01)
*H01L 25/065* (2006.01)

(52) U.S. Cl.
CPC ........ *H01L 23/433* (2013.01); *H01L 25/0655* (2013.01)

(58) Field of Classification Search
CPC .................................................... H01L 23/433
USPC ......................................................... 257/714
See application file for complete search history.

(56) References Cited

U.S. PATENT DOCUMENTS

| | | | |
|---|---|---|---|
| 6,351,384 B1 * | 2/2002 | Daikoku | F28F 3/02 165/80.3 |
| 8,536,711 B2 | 9/2013 | Uchiyama | |
| 8,946,889 B2 | 2/2015 | Katou et al. | |
| 9,564,385 B2 | 2/2017 | Schmit et al. | |
| 10,548,240 B1 | 1/2020 | Iyengar et al. | |
| 10,561,040 B1 | 2/2020 | Lunsman et al. | |

(Continued)

FOREIGN PATENT DOCUMENTS

| | | |
|---|---|---|
| EP | 2988329 A1 | 2/2016 |
| JP | 200532904 A | 2/2005 |

(Continued)

OTHER PUBLICATIONS

Partial European Search Report for European Patent Application No. 20211019.3 dated Jun. 15, 2021. 14 pages.

(Continued)

*Primary Examiner* — Ajay Arora
(74) *Attorney, Agent, or Firm* — Lerner, David, Littenberg, Krumholz & Mentlik, LLP (57) ABSTRACT

Systems and methods for utilizing the dead space around the periphery of a chip for sealing a direct liquid cooled module are disclosed. One of the functions of a direct liquid cooled module is to provide cooling liquid to components located on a chip. A groove member for receiving a sealing member may be applied to the top surface of the chip. The groove member may be directly deposited to the top surface or coupled thereto via an adhesive and/or epoxy. The groove member may be in the form of opposing sidewalls or a u-shaped structure each of which form a partial enclosure for receipt of the sealing member. The groove member may be located entirely within the dead space or at least partially within the dead space and partially within a central area in which the chip components are located. The sealing member may be an O-ring or a gasket.

21 Claims, 10 Drawing Sheets

(56) References Cited

U.S. PATENT DOCUMENTS

| | | | |
|---|---|---|---|
| 2003/0178176 A1* | 9/2003 | Jenkins | F28F 21/067 257/E23.098 |
| 2006/0183328 A1 | 8/2006 | Barstad et al. | |
| 2008/0284047 A1 | 11/2008 | Tosaya et al. | |
| 2016/0064303 A1* | 3/2016 | Ninomiya | H01L 23/3675 165/80.4 |
| 2018/0211900 A1 | 7/2018 | Gutala et al. | |
| 2019/0327859 A1 | 10/2019 | Iyengar et al. | |

FOREIGN PATENT DOCUMENTS

| | | | |
|---|---|---|---|
| JP | 2007250918 A | 9/2007 |
| JP | 2014192409 A | 10/2014 |
| WO | 2014171276 A1 | 10/2014 |

OTHER PUBLICATIONS

Extended European Search Report for European Patent Application No. 20211019.3 dated Sep. 15, 2021. 13 pages.

* cited by examiner

DIRECT LIQUID COOLING WITH O-RING SEALING

BACKGROUND

Complementary Metal Oxide Semiconductor ("CMOS") circuits are found in several types of electronic components, including microprocessors, batteries, and digital camera image sensors. The main features of CMOS technology are low static power consumption and high noise immunity.

In addition to industry standard chip packages, special purpose silicon is likely to produce a significant amount of heat in servers. This may be encountered in graphics processing units ("GPUs"), custom application-specific integrated circuits ("ASICs") and high bandwidth memory ("HBM"). Further, services such as imaging and artificial intelligence ("AI") will likely require large compute resources at a high density, with many servers in close proximity to one another. Data centers around the globe are being mandated to simultaneously increase energy efficiency, consolidate operations and reduce costs. To accommodate these high performance and high density servers, data center operators must grapple with not only the increased power densities but also the thermal challenges that they present.

Because liquid is many times better at storing and transferring heat than air, liquid cooling solutions can provide immediate and measurable benefits to compute efficiency, density and performance. The use of direct liquid cooled modules can increase compute performance and density and decrease energy consumption.

Electronic component packages are subject to a wide range of temperature differentials. Due to differences in the thermal coefficient of expansion ("CTE") of the various package components, the electronic component package may warp as the temperature of the electronic component package changes.

BRIEF SUMMARY

To control warpage, direct liquid cooled modules including manifolds and stiffeners may be incorporated into the electronic component package. The direct liquid cooled module is designed with sealing members such that fluid does not leak therefrom. A sealing member, such as an O-ring or gasket, can provide for hermetically sealing a liquid delivery manifold to the top of a heat dissipating component. The sealing member may reside in a window of a groove body located approximately along the perimeter of the top surface of the heat dissipating component. The presence of the sealing member received in the window of the groove body on the heat dissipating component provides a hermetic seal between the manifold device and component substrate, and thereby enables direct liquid cooling of the heat dissipating components by different methods.

The O-ring and/or gasket seal technology enables direct liquid cooling of one or more heat dissipating components such as a microprocessors, memory chips, etc., which enables liquid to come in direct contact with the components. This facilitates cooling by a hermetically attached structure on a chip, for example, with O-ring grooves and sealing.

A first aspect is an assembly including a substrate and a sealing support structure. The substrate has a top surface, a bottom surface and side surfaces connecting the top and bottom surfaces, the top surface of the substrate has a perimeter area free of circuitry and a central area in which circuitry is located. The sealing support structure forms a partial enclosure adapted to receive at least a portion of a sealing member. At least a portion of the sealing support structure is located within the perimeter area of the top surface of the substrate.

In one example, a first portion of the sealing support structure is located within the perimeter area and a second portion of the sealing support structure is located within the central area.

In another example, the partial enclosure of the sealing support structure includes first and second opposing side walls. The first and second opposing side walls are each deposited directly to the top surface of the substrate.

In yet another example, the partial enclosure of the sealing support structure is u-shaped, and wherein a base portion of the sealing support structure is directly coupled to the top surface of the substrate.

In another example of the present aspect, an adhesive layer bonds the sealing support structure to the top surface of the substrate.

In another example, the sealing support structure is coupled to one of the side surfaces and the top surface of the substrate.

In still yet another example, the assembly includes an adhesive layer. The adhesive layer couples at least a portion of the sealing support structure to at least one of the one of the side surface and the top surface of the substrate.

In another example, the sealing support structure has a rectangular perimeter and a sealing member is at least partially received within the sealing support structure. In one example, the sealing member is an O-ring.

Another aspect is a sealing support structure including a base portion and first and second opposing side walls together forming a partial enclosure adapted to receive at least a portion of a sealing member. The base portion has a bottom surface adapted to bond to a top surface of a substrate having a top surface, a bottom surface and side surfaces connecting the top and bottom surfaces, the top surface of the substrate having a perimeter area free of circuitry and a central area in which circuitry is located. At least a portion of the sealing support structure is located within the perimeter area of the top surface of the substrate.

In one example, a first portion of the sealing support structure is located within the perimeter area and a second portion of the sealing support structure is located within the central area.

In another example, the first and second opposing side walls are each deposited directly to the base portion.

In yet another example, the partial enclosure is u-shaped.

In still yet another example, the sealing support structure further includes an adhesive layer bonding the base portion to the top surface of the substrate.

In another example, the base portion is coupled to one of the side surfaces and the top surface of the substrate.

In yet another example, the sealing support structure further includes an adhesive layer coupling at least a portion of the base portion to at least one of the one of the side surface and the top surface of the substrate.

In still yet another example, the sealing member is an O-ring adapted to be at least partially received within the partial enclosure formed by the base portion and first and second opposing side walls.

Another aspect is an assembly including a substrate, a sealing support structure and a top plate. The substrate has a top surface, a bottom surface and side surfaces connecting the top and bottom surfaces, the top surface of the substrate having a perimeter area free of circuitry and a central area in which circuitry is located. The sealing support structure forms a partial enclosure adapted to receive at least a portion of a sealing member. The top plate has a top surface and a bottom surface, and when the bottom surface of the top plate contacts a top surface of the sealing support member, the sealing member provides a hermetic seal between the top plate and the substrate.

In one example, the assembly further includes a fastener for coupling the top plate to the substrate, wherein the fastener applies a compressive load to the sealing member.

DETAILED DESCRIPTION

Figure 1A:
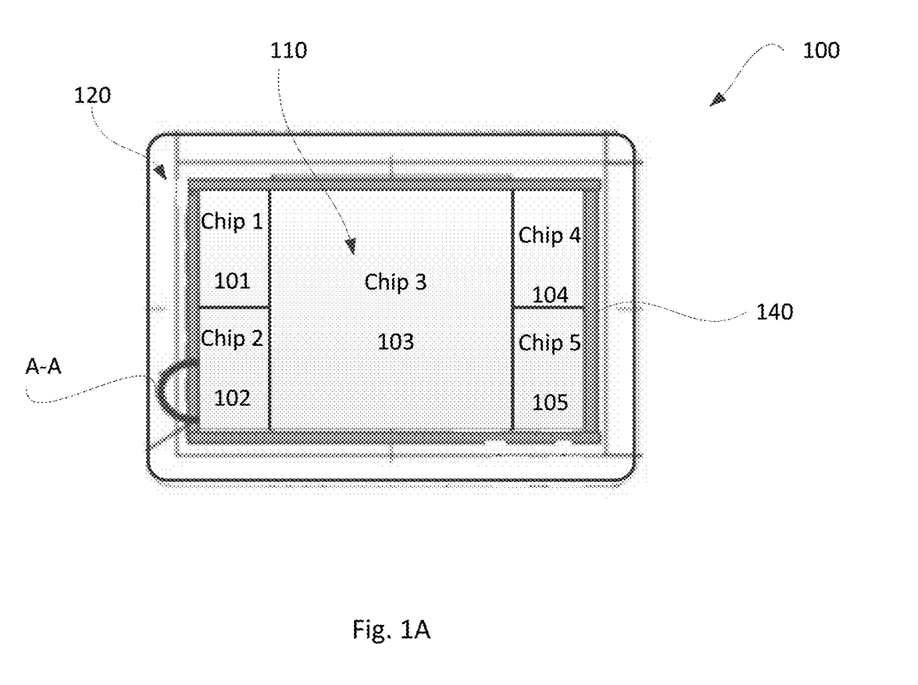
FIG. 1A is a top plan view of an assembly with a sealing support structure on a top surface thereof.

FIG. 1A is a top plan view of an example assembly 100 with various processing components. In this example, the assembly 100 includes a plurality of chips 101-105 mounted on substrate 115. Each of the plurality of chips 101-105 may be, for example, an integrated circuit ("IC") chip, system on chip ("SoC"), or portion thereof, that may include various passive and active microelectronic devices such as resistors, capacitors, inductors, diodes, metal-oxide semiconductor field effect ("MOSFET") transistors, CMOS transistors, bipolar junction transistors ("BJTs"), laterally diffused metal-oxide-silicon ("LDMOS") transistors, high power MOS transistors, other types of transistors, memory devices, logic devices, or other types of circuits or devices. Substrate 115 can be, for example, a silicon substrate, a plastic substrate, a flexible substrate having polyimide and copper layers for example, a laminate substrate, a ceramic substrate, an interposer, or any other suitable support structure.

In the present example, there are five chips 101-105 that together form a central area 110 of the assembly. In other examples, assembly 100 can include more or fewer chips, and the chips can be arranged in other locations and/or with different spacing, configurations, etc.

A perimeter area 120 lies outside the central area 110. Perimeter area 120 can be a top surface 108 of the substrate 115. Perimeter area 120 may be referred to as "dead space" on substrate 115 in that there are no processing components located in this area. The perimeter 120 may be used for loading of other direct liquid cooled module system components, such as sealing features. The direct liquid cooled module may bring coolant to the components of the chip. The module may be hermetically sealed so that the coolant may only be expelled from the system through an outlet in the module. A sealing support structure 140 is applied to top surface of substrate 115. As shown in FIG. 1A, sealing support structure 140 has a rectangular shape. In other examples, sealing support structure 140 can take the form of shapes other than rectangular, such as square, ovular, or circular, for example. In the present example, sealing support structure 140 is continuous in that it does not have any spaces or gaps about its perimeter, including at any corner thereof. In other examples, sealing support structure 140 may have one or more spaces or gaps about its perimeter. In one example, groove body 140 is made of copper. In other examples, sealing support structure 140 may be brass, bronze or an alloy of copper, brass and/or bronze. In one example, sealing support structure may be located partially within central area 110 and partially within perimeter area 120. In another examples, sealing support structure 140 may be only located within perimeter area 120 or dead space of substrate 115.

Figure 1B:
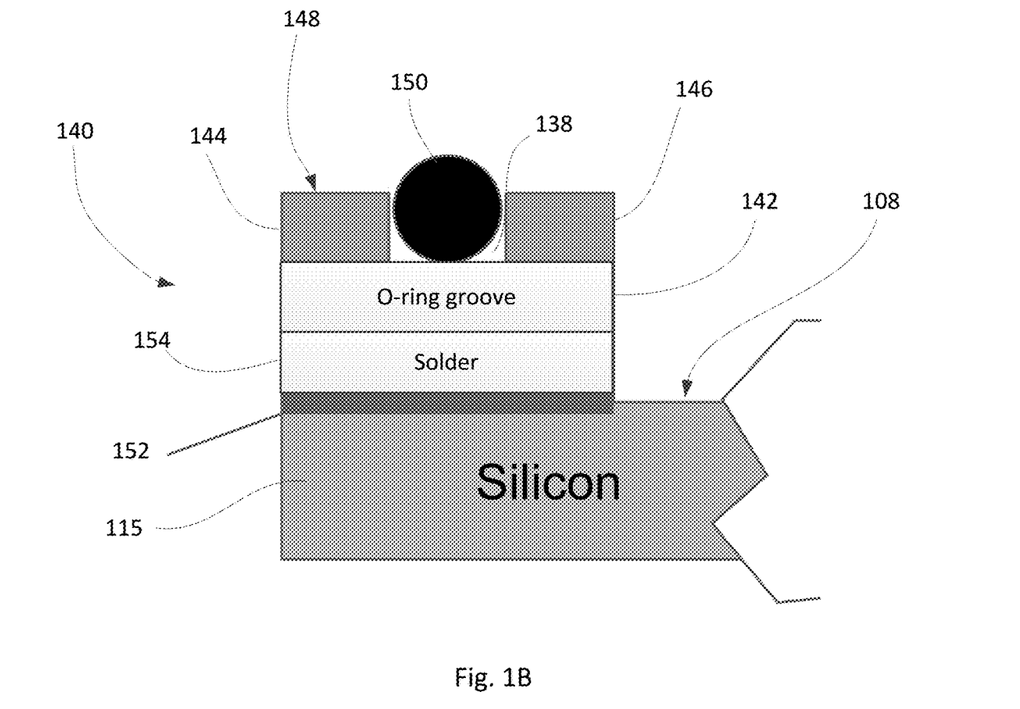
FIG. 1B is an enlarged front plan cross-sectional view of section A-A of FIG. 1 and shows sealing support structure including solder and a metallization process for coupling the groove body to the top surface of the chip and/or substrate.

FIG. 1B illustrates an example of the sealing support structure 140. The sealing support structure 140 includes a partial enclosure or window 138 configured to receive an O-ring or gasket 150.

FIG. 1B is an enlarged front plan cross-sectional view of section A-A of FIG. 1A. In this example, a sealing member 150 in the form of an O-ring rests within window 138 of sealing support structure 140. In other examples, sealing member 150 may be a gasket. Sealing support structure 140 may include a base portion 142 and first and second wall portions 144, 146 as shown in FIG. 1B, which define a partial enclosure or window 138.

Sealing support structure 140 may be applied to top surface 108 of substrate 115 in various ways. In the present example, a thin metal layer 152 is deposited on the substrate 115). A solder layer 154 attaches sealing support structure 140 to metal layer 152. This technique forms a fluid tight seal between sealing support structure 140 and substrate 115.

Sealing support structure 140 may be deposited as a unitary structure or in layers. In one example shown in FIG. 2A, sealing support structure 140 is formed by a first layer 143 and a second layer 145. Base portion 142 corresponds to layer 143, and first and second wall portions 144, 146, forming a groove body, correspond to layer 145.

Figure 2A:
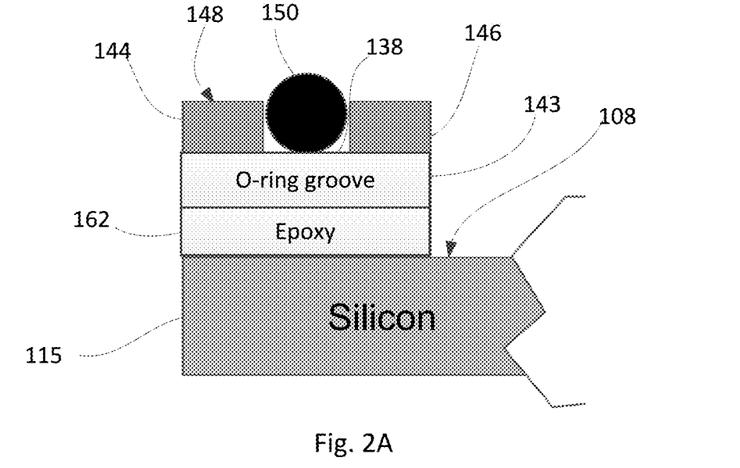
FIG. 2A is a front plan cross-sectional view of one example of the sealing support structure including epoxy.

The diameter of O-ring 150 is such that in an uncompressed state, a portion of O-ring 150 lies above a top surface 148 of the groove body. This allows for a separate component to compress O-ring 150 fully into the area of sealing support structure 140 and to provide a seal between sealing support structure 140 and the separate component.

Figure 2B:
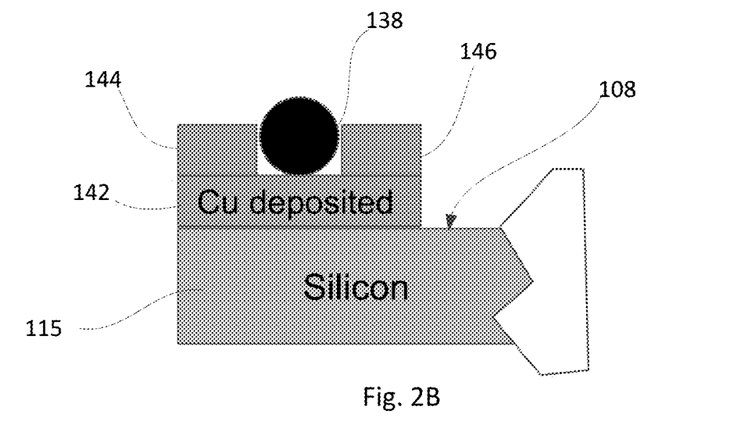
FIG. 2B is a front plan cross-sectional view of one example of the sealing support structure including copper deposited directly to the top surface of the substrate.
Figure 2C:
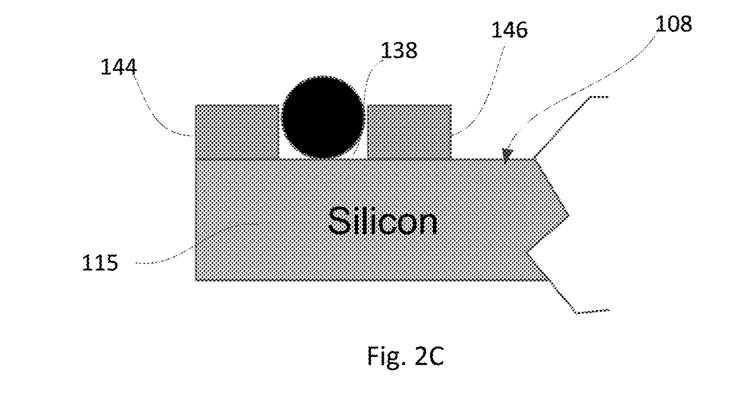
FIG. 2C is a front plan cross-sectional view of one example of the sealing support structure deposited directly to the top surface of the substrate.

FIGS. 2A-2C show additional examples of groove bodies 140 on top surface 108 of chip 100 and/or substrate 115. In FIG. 2A, sealing support structure 140 includes epoxy coupling sealing support structure 140 directly to the top surface 108 of substrate 115. According to some examples, a layer of epoxy 162 may be applied between substrate 115 and base layer 143. The epoxy 162 may mechanically couple together sealing support structure 140 and substrate 115. Any type of epoxy or adhesive used in the industry including but not limited to natural adhesive, synthetic adhesive, drying adhesives, thermoplastic adhesives, reactive adhesives, pressure sensitive adhesives, or any other commonly used adhesive may be used.

In FIG. 2B, sealing support structure includes only a copper layer 142 and first and second wall portions 144, 146. The copper layer 142 is deposited directly to the top surface 108 of substrate 115. In this example, a copper layer 142 of the sealing support structure is bonded directly to chip 100 and/or substrate 115.

In FIG. 2C, sealing support structure includes only the first and second wall portions 144, 146, which are deposited directly to the top surface 108 of chip 100 and/or substrate 115.

Figure 3A:
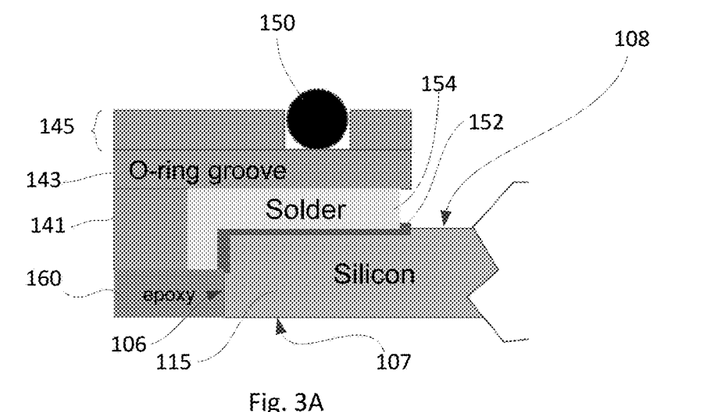
FIG. 3A is a front plan cross-sectional view of one example of a groove body overhang including epoxy, solder and a metallization process for coupling the sealing support structure to side and top surfaces of the substrate.
Figure 3B:
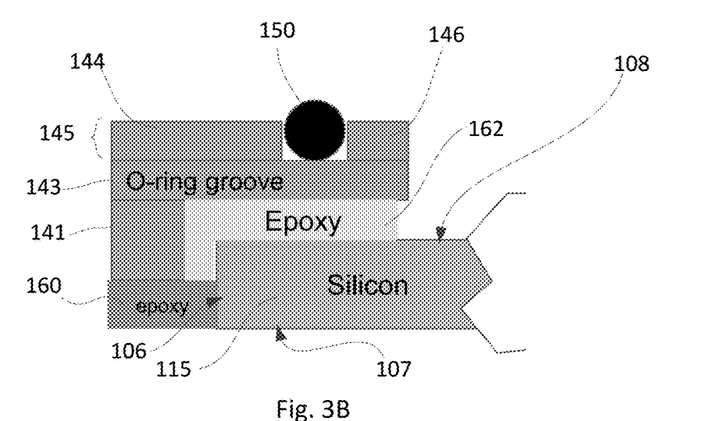
FIG. 3B is a front plan cross-sectional view of one example of a groove body overhang including epoxy for coupling the sealing support structure to side and top surfaces of the substrate.
Figure 3C:
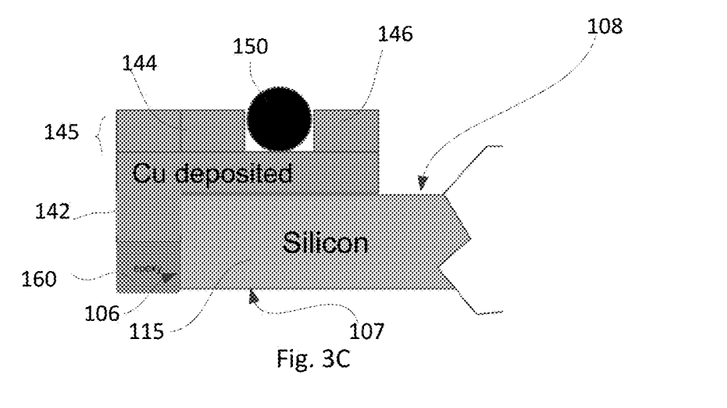
FIG. 3C is a front plan cross-sectional view of one example of a groove body overhang including epoxy for coupling at least a portion of the sealing support structure to the side of substrate and coupling another portion of the sealing support structure directly to the top surface of the substrate.

FIGS. 3A-3C show examples of groove bodies 140 bonded to both a side surface 106 and top surface 108 of chip 100 and/or substrate 115. In FIG. 3A, sealing support structure 140 is in the form of an overhang such that a portion lies adjacent side surface 106 and another portion thereof lies adjacent top surface 108 of chip 100 and/or substrate. In this example, sealing support structure 140 is still oriented above top surface 108 of chip 100 and/or substrate. A sealing member 150 in the form or an O-ring rests within sealing support structure 140. In other examples, sealing member 150 may be a gasket. In the present example, sealing support structure 140 has an additional layer 141 to layers 143 and 145. Base portion of sealing support structure 140 in the present example includes both layers 141 and 143. First and second wall portions 144, 146 define layer 145.

In the present example, a layer of epoxy 160 is applied to a portion of side surface 106 of substrate 115 and lies parallel with a bottom surface 107 of substrate 115. A thin metal layer 152 is deposited on both side surface 106 above the epoxy 160 and top surface 108 of substrate 115. A solder layer 154 secures sealing support structure 140 to metal layer 152. A portion of sealing support structure 140, solder layer 154, and thin metal layer 152 each lie adjacent and contact epoxy layer 160. This technique forms a fluid tight seal between sealing support structure 140 and substrate 115.

In FIG. 3B, a layer of epoxy 160 is also applied to a portion of side surface 106 of substrate 115 and lies parallel with a bottom surface 107 of substrate 115. A second layer of epoxy 162 is deposited on both side surface 106 and top surface 108 of substrate 115. The epoxy layers 160, 162 form a base for sealing support structure 140 that extends beyond an edge of the substrate.

In FIG. 3C, a layer of epoxy 160 is also applied to a portion of side surface 106 of substrate 115 and lies parallel with a bottom surface 107 of substrate 115. In this example, sealing support structure 140 includes a base copper layer 142 deposited directly onto epoxy 160 at side surface 106 and top surface 108 of substrate 115.

Figure 4A:
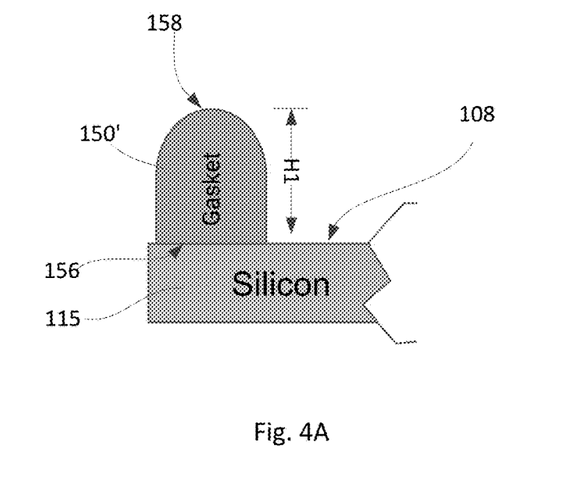
FIG. 4A is a front plan cross-sectional view of one example of directly coupling a gasket to a top surface of substrate.
Figure 4B:
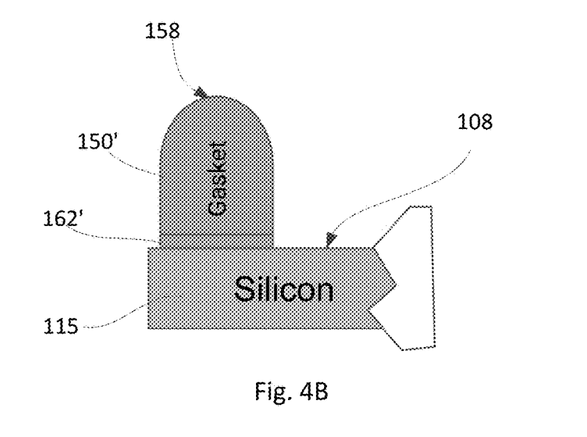
FIG. 4B is a front plan cross-sectional view of one example of coupling a gasket to a top surface of a substrate with an intermediate adhesive layer.
Figure 4C:
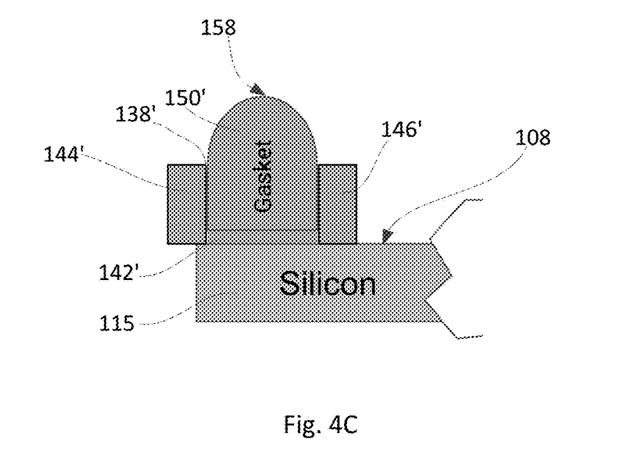
FIG. 4C is a front plan cross-sectional view of one example of depositing of a sealing support structure directly to a top surface of a substrate and inserting a gasket into a groove in the sealing support structure.

FIGS. 4A-4C are various examples of cure-in-place gasket options. In one example, a gasket 150' starts off as a liquid applied directly to silicon and then is cured by UV light to create the shape shown in FIGS. 4A-4C.

In FIG. 4A, a gasket 150' is directly coupled to a top surface 108 of a chip 100 and/or substrate 115. In the present example, gasket 150' has a flat bottom surface 156 and a curved top surface 158. The gasket is shown in an uncompressed state where there is no compressive element contacting top surface 158. In the uncompressed state, gasket 150' has a height H1.

In FIG. 4B, an intermediate adhesive layer 162' couples bottom surface 156 of gasket 150' to top surface 108 of chip 100 and/or substrate 115. In FIG. 4C, a sealing support structure 140' is deposited directly on top surface 108 of chip 100 and/or substrate 115. Sealing support structure 140' include a base portion 142' and first and second side wall portions 144', 146'. This partial enclosure or window 138' formed by base portion 142' and first and second side wall portions 144', 146' has a gland design to determine how gasket 150' will compress in sealing support structure 140'.

Figure 5A:
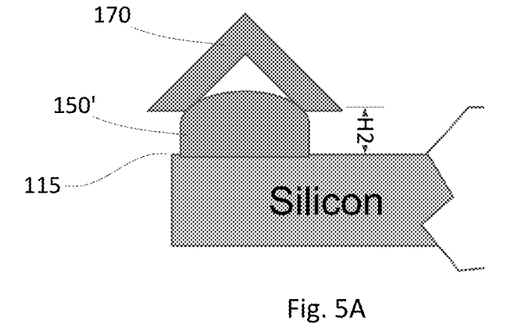
FIG. 5A is a front plan view of compressing the gasket of FIG. 4A with a first type of compressive element.
Figure 5B:
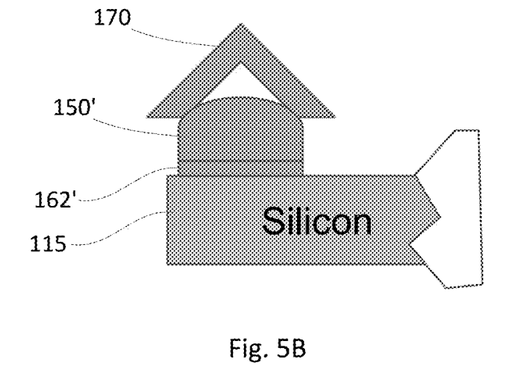
FIG. 5B is a front plan cross-sectional view of compressing the gasket of FIG. 4B with the compressive element of FIG. 5A.
Figure 5C:
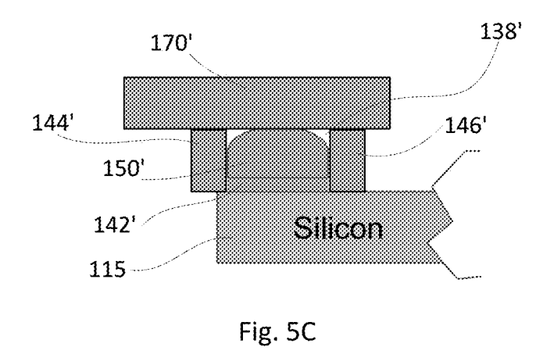
FIG. 5C is a front plan cross-sectional view of compressing the gasket of FIG. 4C with another type of compressive element.

FIGS. 5A-5C correspond to FIGS. 4A-4C respectively and show how gasket 150' reacts under a compressive load applied thereto. In FIGS. 5A-5B, a compressive element 170 compresses gasket 150' such that gasket 150' is compressed into a height H2 less than HE While the compressive element 170 is shown in the figures as v-shaped, it should be understood that the compressive element may alternatively be u-shaped, flat, or any of a variety of other shapes. The curing technique used for curing the gasket may determine physical properties of the gasket. For example, a type of liquid, a wavelength and frequency of UV light, and curing time used may determine the properties of gasket 150' and how much the height of gasket 150' changes when compressed including the amount of force imparted on gasket 150'. In FIG. 5C, a planar compressive element 170' compresses gasket 150' until a bottom surface 172 of compressive element 170' contacts a top surface 174 of each of first and second wall portions 144', 146'.

Figure 6A:
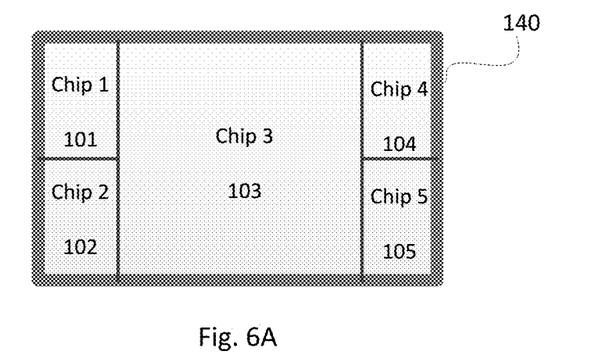
FIGS. 6A-C illustrate example sealing structure configurations according to aspects of the disclosure.
Figure 6B:
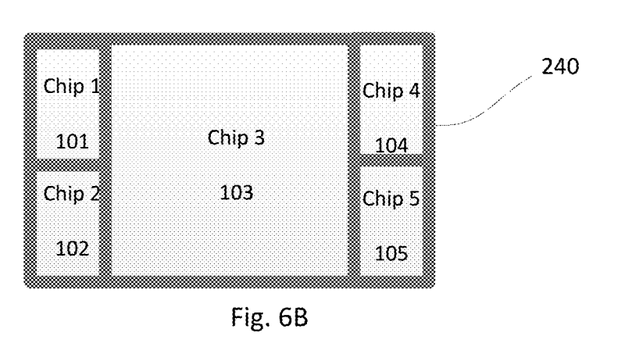
Figure 6C:
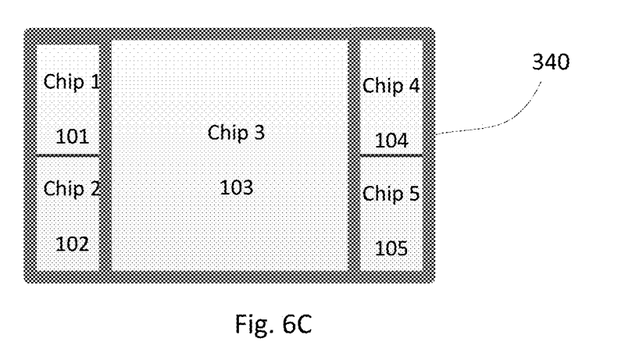

FIGS. 6A-C illustrate various example configurations for the sealing support structure in relation to the circuitry to be cooled by a direct cooling system sealed by the sealing support structure.

FIG. 6A provides an example sealing structure 140 configured as described above in connection with FIG. 1A. In particular, in this example, the sealing support structure 140 extends around a periphery of the processing components.

FIGS. 6B and 6C show examples where the sealing support structures are configured to form separate cooling zones. In FIG. 6B, sealing support structure 240 surrounds each chip 101-105 separately.

In FIG. 6C, sealing support structure 340 also forms separate cooling zones, though fewer than in FIG. 6B. In this example, the sealing support structure 340 surrounds the central chip 103, and surrounds pairs of the peripheral chips 101, 102, 104, 105, rather than surrounding each chip separately as in FIG. 6B.

The configuration for the sealing support structure may be selected based on cooling needs, space for constructing the support structure, and other considerations. While a few example configurations are shown, it should be understood that any number of configuration are possible, and that the configurations may be adapted to various configurations of electronic components.

Figure 7A:
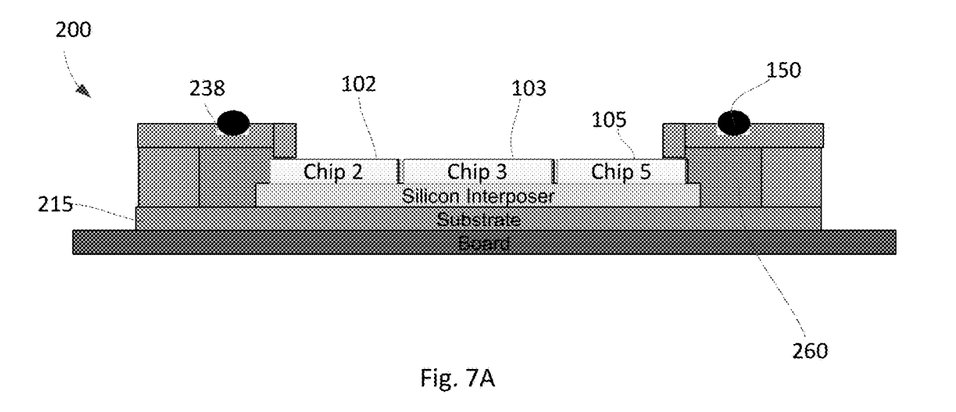
FIG. 7A is a front plan cross-sectional view of a microchip package including one example of an O-ring groove.
Figure 7B:
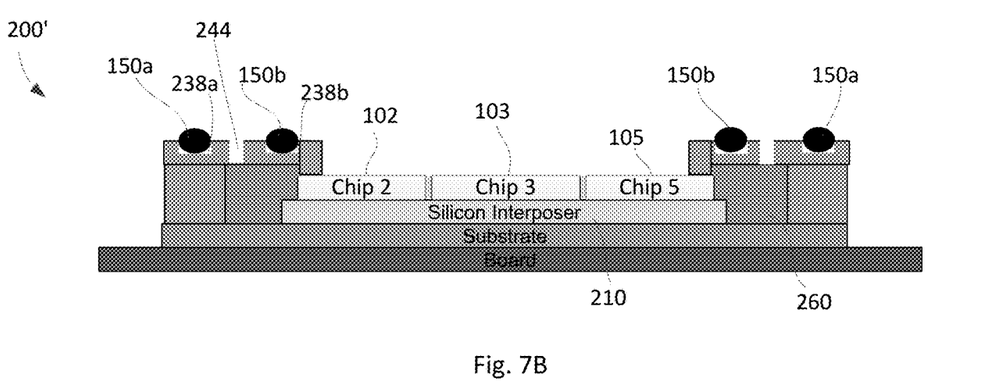
FIG. 7B is a front plan cross-sectional view of an example of a microchip package having first and second windows in a groove body with a space between the windows for receipt of epoxy.
Figure 7C:
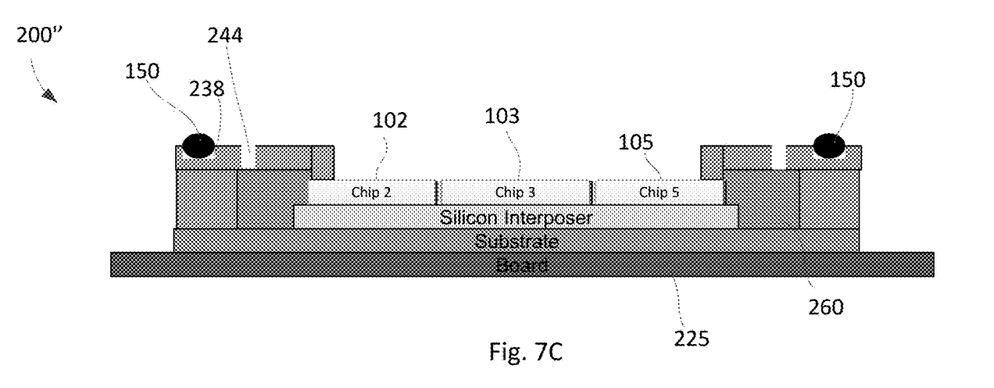
FIG. 7C is a front plan cross-sectional view of an example of a microchip package with a groove body having an opening for receipt of epoxy.

FIGS. 7A-7C are examples of various sealing support structures with one or more windows that can be applied to respective subassemblies 200, 200' and 200" of a direct liquid cooled module. Each of these figures is a cross-sectional front plan view as opposed to the top view of FIG. 1A, for example. Therefore, while it looks like there are multiple groove bodies in FIG. 7A for example, there is only one sealing support structure 240 that forms a closed perimeter as does the sealing support structure 140 of FIG. 1A. Each of the respective subassemblies of FIGS. 7A-7C, includes chips 101-105, a silicon interposer 210, a substrate 215, and a printed circuit board 225. An epoxy 260 acts as a filler and support for the groove bodies 240.

In FIG. 7A, there is a single sealing support structure 240. An O-ring or gasket 150 sits in window 238 of sealing support structure 240. Sealing support structure 240 wraps around a top portion of epoxy 260 such that a portion of sealing support structure 240 contacts both substrate 115 and chips 102, 105.

In FIG. 7B, there is an external window 238a and an internal window 238b in sealing support structure 240. An aperture 244 between windows 238a, 238b allows epoxy 260 to be provided in an enclosure formed by windows 238a, 238b, chips 102, 105, silicon interposer 210 and substrate 215. O-ring or gasket 150a is received within window 238a and O-ring or gasket 150b is received within window 238b.

In FIG. 7C, there is only one window 238 in sealing support structure 240, but there is still an aperture 244 adjacent window 238 and through sealing support structure 240 to allow epoxy to be received in an enclosure formed by sealing support structure 240, chips 102, 105, silicon interposer 210 and substrate 215. In this example, O-ring 150 or gasket is received within window 238 of sealing support structure 240.

Figure 8A:
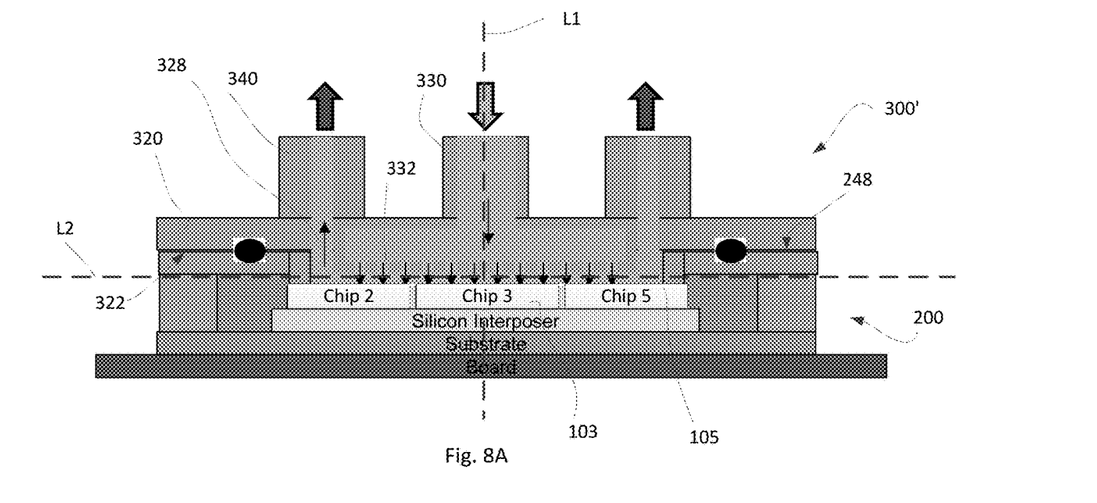
FIG. 8A is a front plan cross-sectional view of a microchip package including one example of a subassembly including a groove body coupled to a jet impingement structure for delivering coolant to the package.
Figure 8B:
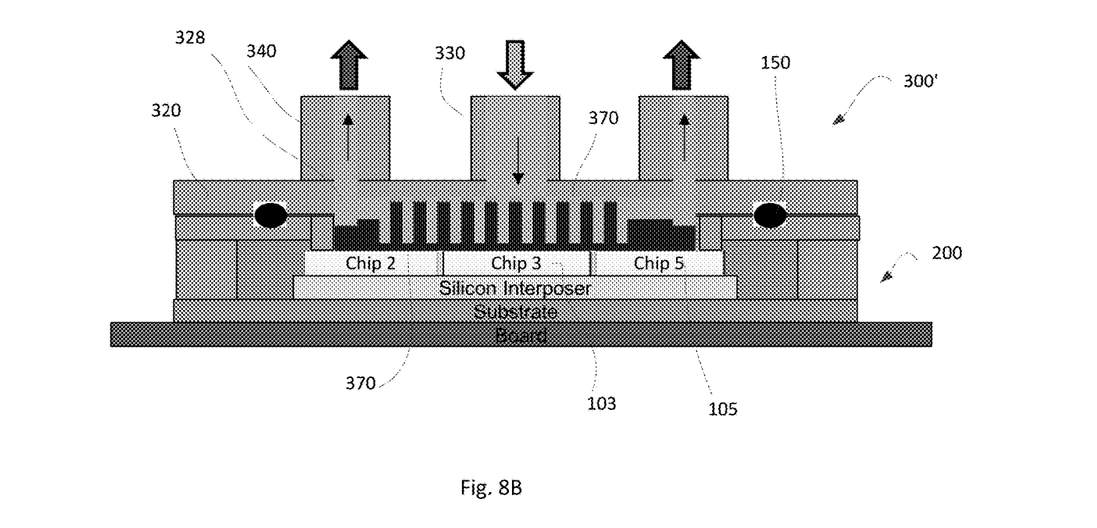
FIG. 8B is a front plan cross-sectional view of a microchip package including one example of a groove body coupled to a manifold structure for delivering coolant to the package.

FIGS. 8A and 8B are examples of respective sealing structures 300', 300" added to subassembly 200 of FIG. 7A. FIG. 8A is the addition of jet impingement structure 300' and FIG. 8B is the addition of a manifold structure 300" for delivering coolant to the module or package. Both jet impingement structure 300' and manifold structure 300" include a top plate 320, in an inlet 330 and outlets 340. When a bottom surface 322 of top plate 320 comes into contact with a top surface 248 of sealing support structure 240 of subassembly 200, O-ring or gasket 150 compresses which creates a hermetic seal between jet impingement structure 300' and subassembly 200.

As shown, there are respective arrow directions to signify the direction of liquid or gas flow through inlet 330 and outlets 340. Each arrow follows along a path that is generally parallel to longitudinal axis L1. In FIG. 8A, liquid or gas enters into the module through inlet 330 and then through jets 332 onto the surface of chips 101-105 before travelling in a longitudinal direction L2 perpendicular to axis L1 and into return tubes 328 along axis L1 again before being expelled from the module through outlets 340.

In FIG. 8B, liquid or gas enters into the module through inlet 330 and then through flow channels 370 onto the surface of chips 101-105 before travelling in a longitudinal direction L2 perpendicular to axis L1 and into return tubes 328 along axis L1 again before being expelled from the module through outlets 340. Flow channels in a manifold are part of a direct liquid cooled module for directing liquid or gas to a chip (such as chips 101-105) that the manifold sits on top of. A manifold is designed to direct flow over one or more circuit components, such as microprocessors, memory chips, etc., in order to improve heat transfer between the components and the working fluid. In one example, a manifold is a component sitting on top of a chip with flow channels that creates a crossflow path for the coolant resulting in improved heat transfer between the chip and the working fluid or gas. In one example, the manifold is made of polyurethane. In other examples, manifold may be made of other polymers.

Figure 9A:
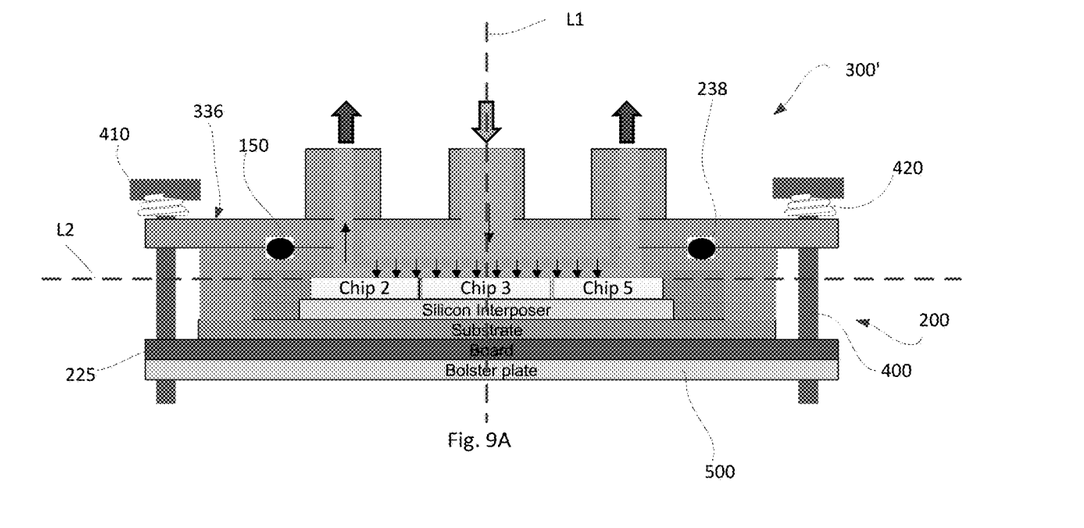
FIG. 9A is a front plan cross-sectional view of a microchip package including a mechanical attachment securing a direct liquid cooled module to the package.
Figure 9B:
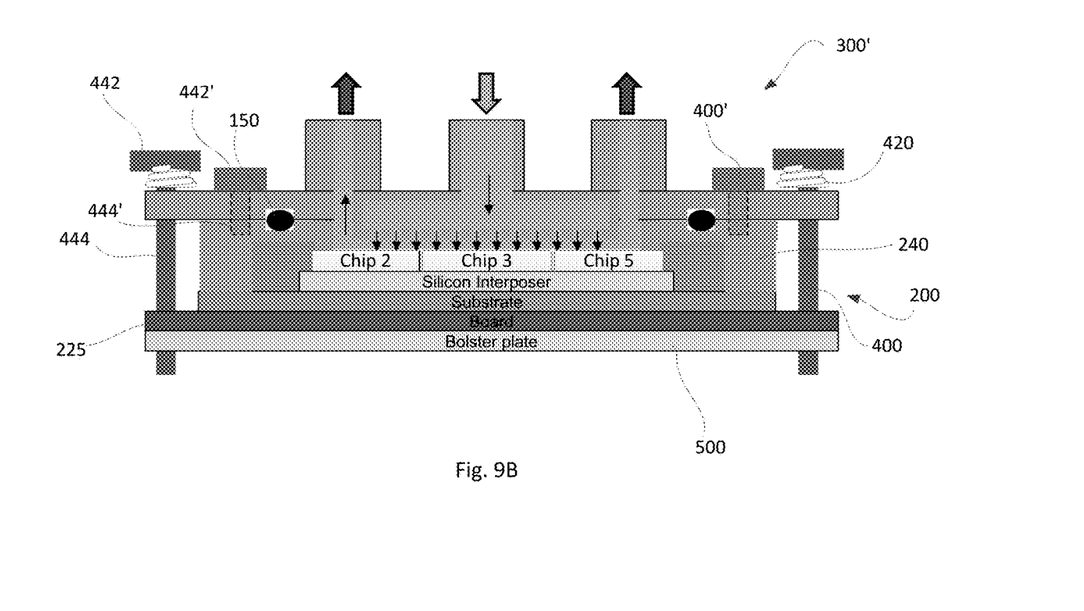
FIG. 9B is a front plan cross-sectional view of a microchip package including another example mechanical attachment securing the direct liquid cooled module to the package.

FIGS. 9A and 9B are examples of loading an O-ring used in a direct liquid cooled module with different mechanical attachments. FIG. 9A shows the use of a spring loaded screw 400 and bolster plate 500 in the direct liquid cooled module of FIG. 8A. Bolster plate 500 is coupled to printed circuit board 225. Screw 400 is inserted through an aperture in top plate 320 and both printed circuit board 225 and bolster plate 500. A spring 420 is compressed between a head 410 of screw 400 and a top surface 336 of top plate 320. This provides a top plate clamp load to O-ring 150 within window 238 of sealing support structure 240. In FIG. 9B, additional screw 400' is used to provide an O-ring clamp load. Screw 400' is inserted through another aperture in top plate 320 and is retained within sealing support structure 240 to apply a compressive loading on O-ring or gasket 150. In one example, the sealing support structure 240 can be a stiffener that sealing support structure 240 is applied to such that screw 400' is inserted through an aperture in top plate 320 and is retained within stiffener to apply a compressive load on O-ring or gasket 250.

Screws 400 and 400' each have respective top portions 442, 442' and threaded shaft portions 444, 444'. In FIG. 9A there are two screws 400 and in FIG. 9B there are two screws 400 and two screws 400'. In other examples, there may be more or less than two screws 400 or two screws 400' used to apply compressive load to one or more O-rings or gasket 250 used in a respective direct liquid cooled module.

Figure 10A:
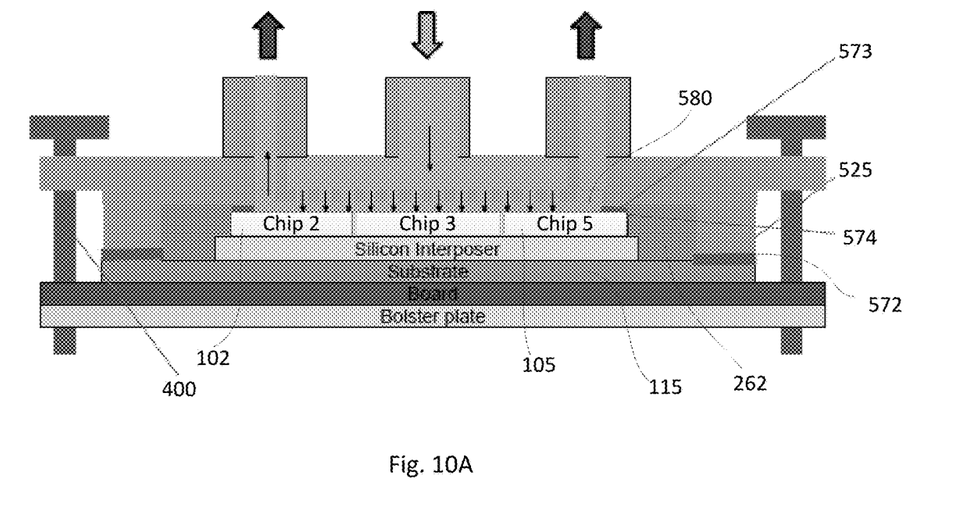
FIG. 10A is a front plan cross-sectional view of a microchip package including another example mechanical attachment securing a direct liquid cooled module to the package.

FIG. 10A provides an example of a lid sealing structure, which may be used without an O-ring or gasket. As shown in this example, lid 525 is configured to extend from a periphery of substrate 115 and form a seal between the chips 102, 105 and the lid 525, thereby preventing leakage of coolant 580. For example, the seal may be formed by adhesive 573 between the chips and the lid 525. The lid 525 may be further secured to the substrate 115 by adhesive 572.

The adhesives 572, 573 may be polymer-based, metal-based, or some combination thereof. Similarly, the lid 525 can be made of any material, such as metal, polymer, or a combination of materials. According to some examples, such as where the adhesive is metal-based, a metallization layer 574 may be deposited on the chips 102, 105 which contact the adhesive 573 or on a surface of the substrate 115 that contacts the adhesive 572. Screws 400 may supply a compressive load to assist the adhesion provided by adhesives 572, 573. According to other examples, a compressive load may be provided by clamping or other mechanical forces.

As shown in FIG. 10A, an epoxy 262 may be deposited between the chips 102, 105 and the lid 525, such that a portion of the lid 525 that extends from the substrate 115 wraps around the epoxy 262. In this regard, the epoxy 262 may provide support for the lid 525. In other examples, different shapes and configurations of lids may not require the epoxy.

Figure 10B:
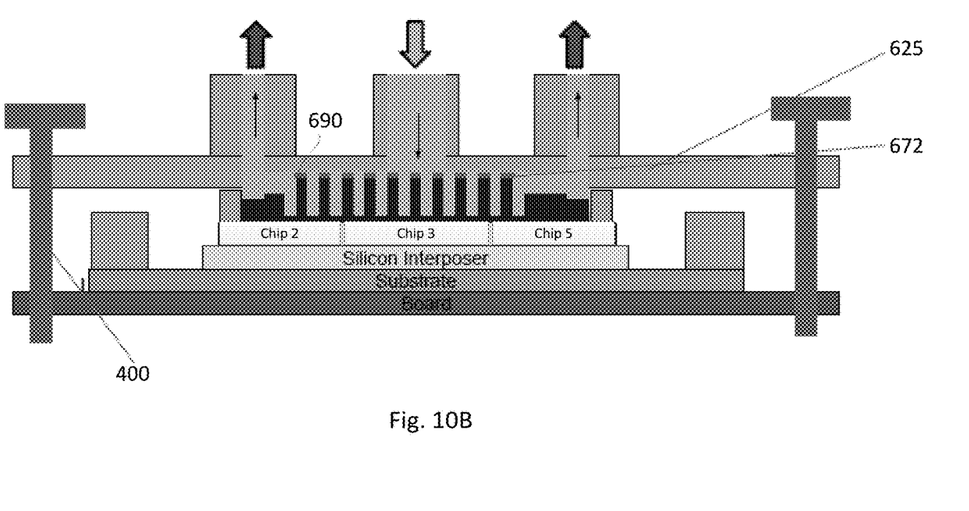
FIG. 10B is a front plan cross-sectional view of a microchip package including another example mechanical attachment securing the direct liquid cooled module to the package.

FIG. 10B provides another example of a lid sealing structure. In this example, lid 625 is bonded to fins 690 of a coolant delivery structure via adhesive 672. Though not shown in this example, additional adhesive may be applied between the lid 625 and other components of the assembly to form a waterproof seal.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible implementations. Further, the same reference numbers in different drawings can identify the same or similar elements.

The invention claimed is:

1. An assembly, comprising:
    a substrate having a top surface, a bottom surface and side surfaces connecting the top and bottom surfaces, the top surface of the substrate having a perimeter area free of circuitry and a central area in which circuitry is located; and
    a sealing support structure forming a partial enclosure adapted to receive at least a portion of a sealing member, the sealing support structure surrounding a pocket that is open in at a top end and extends down to the circuitry such that a coolant delivery device sealingly engaged with the sealing support structure may direct coolant onto the circuitry,
    wherein at least a portion of the sealing support structure is located within the perimeter area of the top surface of the substrate.

2. The assembly of claim 1, wherein a first portion of the sealing support structure is located within the perimeter area and a second portion of the sealing support structure is located within the central area.

3. The assembly of claim 1, wherein the partial enclosure of the sealing support structure includes first and second opposing side walls.

4. The assembly of claim 3, wherein the first and second opposing side walls are each deposited directly to the top surface of the substrate.

5. The assembly of claim 1, wherein the partial enclosure of the sealing support structure is u-shaped, and wherein a base portion of the sealing support structure is directly coupled to the top surface of the substrate.

6. The assembly of claim 1, further comprising:
    an adhesive layer bonding the sealing support structure to the top surface of the substrate.

7. The assembly of claim 1, wherein the sealing support structure is coupled to one of the side surfaces and the top surface of the substrate.

8. The assembly of claim 7, further comprising:
    an adhesive layer,
    wherein the adhesive layer couples at least a portion of the sealing support structure to at least one of the one of the side surface and the top surface of the substrate.

9. The assembly of claim 1, wherein the sealing support structure has a rectangular perimeter, the assembly further comprising:
    a sealing member at least partially received within the sealing support structure.

10. The assembly of claim 9, wherein the sealing member is an O-ring.

11. A sealing support structure comprising:
    a base portion and first and second opposing side walls together forming a partial enclosure adapted to receive at least a portion of a sealing member,
    wherein the base portion has a bottom surface adapted to bond to a top surface of a substrate having a top surface, a bottom surface and side surfaces connecting the top and bottom surfaces, the top surface of the substrate having a perimeter area free of circuitry and a central area in which circuitry is located, and
    wherein at least a portion of the sealing support structure is located within the perimeter area of the top surface of the substrate and surrounds a pocket that is open at a top end and extends down to the circuitry to enable coolant received through the top end to directly contact the circuitry.

12. The sealing support structure of claim 11, wherein a first portion of the sealing support structure is located within the perimeter area and a second portion of the sealing support structure is located within the central area.

13. The sealing support structure of claim 11, wherein the first and second opposing side walls are each deposited directly to the base portion.

14. The sealing support structure of claim 11, wherein the partial enclosure is u-shaped.

15. The sealing support structure of claim 11, further comprising:
    an adhesive layer bonding the base portion to the top surface of the substrate.

16. The sealing support structure of claim 11, wherein the base portion is coupled to one of the side surfaces and the top surface of the substrate.

17. The sealing support structure of claim 16, further comprising:
an adhesive layer,
wherein the adhesive layer couples at least a portion of the base portion to at least one of the one of the side surface and the top surface of the substrate.

18. The sealing support structure of claim 11, wherein the sealing member is an O-ring adapted to be at least partially received within the partial enclosure formed by the base portion and first and second opposing side walls.

19. An assembly comprising:
a substrate;
one or more chips arranged on the substrate;
a sealing support structure form shaped to adhere to at least a portion of the one or more chips; and
an adhesive between the sealing support structure and the at least a portion of the one or more chips,
wherein the adhesive and the sealing support structure provide a hermetic seal for coolant delivered to the one or more chips.

20. The assembly of claim 19, wherein the substrate has a top surface, a bottom surface and side surfaces connecting the top and bottom surfaces, the top surface of the substrate having a perimeter area free of the one or more chips, and wherein the sealing support structure further comprises an extension adhered to the perimeter area of the substrate.

21. The assembly of claim 19, further comprising a coolant delivery structure including a plurality of cooling fins, wherein the sealing support structure is further adhered to a top surface of each of the plurality of cooling fins.

\* \* \* \* \*